United States Patent
Binner

(10) Patent No.: US 9,060,427 B2
(45) Date of Patent: Jun. 16, 2015

(54) ELECTRONIC DEVICE HOUSING

(71) Applicant: WAGO Verwaltungsgesellschaft mbH, Minden (DE)

(72) Inventor: Lars Binner, Melle (DE)

(73) Assignee: WAGO VERWALTUNGESELLSCHAFT MBH, Minden (DE)

( * ) Notice: Subject to any disclaimer, the term of this patent is extended or adjusted under 35 U.S.C. 154(b) by 169 days.

(21) Appl. No.: 13/926,268

(22) Filed: Jun. 25, 2013

(65) Prior Publication Data
US 2013/0341083 A1 Dec. 26, 2013

(30) Foreign Application Priority Data

Jun. 25, 2012 (DE) .......................... 10 2012 105 509

(51) Int. Cl.
| | |
|---|---|
| H05K 7/02 | (2006.01) |
| H05K 5/02 | (2006.01) |
| H01R 9/26 | (2006.01) |
| H01R 13/635 | (2006.01) |
| H05K 7/14 | (2006.01) |

(52) U.S. Cl.
CPC ............ H05K 5/0247 (2013.01); H01R 9/2625 (2013.01); H01R 13/635 (2013.01); H05K 7/1469 (2013.01)

(58) Field of Classification Search
USPC ............ 174/541, 542; 361/732, 809; 439/160
See application file for complete search history.

(56) References Cited

U.S. PATENT DOCUMENTS

| | | | |
|---|---|---|---|
| 4,531,795 A | 7/1985 | Sinclair | |
| 6,629,852 B2 | 10/2003 | Mori et al. | |
| 6,666,484 B1 | 12/2003 | Branch et al. | |
| 6,808,401 B2* | 10/2004 | Guzeldereli et al. | 439/160 |
| 6,888,724 B2* | 5/2005 | Shaie | 361/719 |
| 7,175,470 B2* | 2/2007 | Kangas | 439/483 |
| 7,252,523 B1* | 8/2007 | Pennypacker et al. | 439/160 |
| 7,386,868 B2* | 6/2008 | McCormack | 720/657 |
| 8,517,746 B2* | 8/2013 | Manickam | 439/160 |
| 2003/0109157 A1* | 6/2003 | Koerber et al. | 439/160 |
| 2007/0149018 A1* | 6/2007 | Gunther et al. | 439/160 |
| 2008/0032532 A1* | 2/2008 | Tsai | 439/160 |
| 2012/0149223 A1* | 6/2012 | Feldman et al. | 439/157 |

FOREIGN PATENT DOCUMENTS

| | | |
|---|---|---|
| DE | 692 00 531 | 5/1995 |
| DE | 698 14 299 | 1/2004 |
| DE | 20 2008 002 111 | 6/2009 |

* cited by examiner

Primary Examiner — Hung V Ngo
(74) Attorney, Agent, or Firm — Renner, Otto, Boisselle & Sklar, LLP.

(57) ABSTRACT

An electronic device housing having a plug contact unit with contacts for making electrical contact with a connector which can be plug-mounted onto an associated plug contact unit is described. The plug contact unit has an ejector unit mounted to pivot about an axis and which has at least one ejector arm positionable in an intermediate space, which is provided in the plugged state of a plug connector on a plug contact unit, between the connector and the plug contact unit. The ejector unit has a strip extending along the axis and has a protruding cross section. The electronic device housing has a latching groove for pivotably mounting in each case one associated ejector unit, wherein the latching groove surrounds and pivotably mounts the associated strip over a circumference of more than 180°, the latching groove and the strip extending along the width of the ejector unit.

10 Claims, 9 Drawing Sheets

ELECTRONIC DEVICE HOUSING

The invention relates to an electronic device housing having at least one plug contact unit with contact elements for making electrically conductive contact with a plug connector which can be plug-mounted onto an associated plug contact unit, wherein the at least one plug contact unit has an ejector unit which is mounted such that it can pivot about a pivot axis and which has at least one ejector arm which can be positioned in a beneath the plug connector in the plugged state of a plug connector on a plug contact unit.

Electronic device housings are known in various forms, for example as industrial housings which can be latched onto a mounting rail. Industrial housings of this kind are also supplied in the form of modular installation housings with a housing cover or housing upper part which can be plug-mounted, it being possible for customer-specific printed circuit boards with plug contact units soldered thereon to be inserted into said modular installation housings.

DE 20 2008 002 111 U1 discloses an electronics housing of this kind which can be connected in series and has male or female connector strips onto which corresponding female connector strips or male connector strips can be plug-mounted. The male or female connector strips of the electronics housing which can be connected in series are located on the narrow end faces and form plug contact units which are accessible from the outside. An unlocking apparatus with an unlocking clip is pivotably arranged in each case on the plug contact unit of the electronic device housing or on the corresponding male or female connector strip which can be plug-mounted.

U.S. Pat. No. 6,629,852 B2 discloses a relay base having an ejector lever which is mounted on the relay base housing in a pivotable manner. To this end, bearing pins project from both sides of the ejector lever, said bearing pins entering the corresponding openings in the relay base housing in order to form a pivot bearing.

U.S. Pat. No. 4,531,795 A describes a plug connector base with L-shaped ejector levers which are situated laterally opposite one another. The ejector levers have laterally projecting bearing pins which are inserted into a bearing slot from below in order to form a pivot bearing at the end of the bearing slot.

DE 692 00 531 T2 discloses a multiple-row male connector strip having ejector levers which are pivotably mounted on the sides. In this case, the ejector levers are inserted into a trough-like recess in the male connector strip base. The ejector levers have slots for receiving a support of the base part and also locking fingers which engage over locking heads, which are arranged on the support, to form a latching position. During this process of locking fingers engaging over locking heads, these lateral limbs of the ejector are deflected outward.

Proceeding from the above, the object of the present invention is to provide an electronic device housing with an improved ejector unit.

The object is achieved by the electronic device housing having the features of Claim 1.

Advantageous embodiments are described in the dependent claims.

It is proposed that the ejector unit, in order to be pivotably mounted, has a strip which extends along the pivot axis and has a protruding cross section. The electronic device housing has at least one latching groove for pivotably mounting in each case one associated ejector unit, wherein the latching groove surrounds and pivotably mounts the associated protruding strip over a circumference of more than 180°.

In contrast to the laterally projecting latching pins known from the prior art, the protruding strip provides more stable mounting of the ejector unit on the electronic device housing. The forces and moments which occur during operation of the ejector unit are distributed uniformly over the electronic device housing by the protruding strip and the corresponding latching groove. Since the latching groove surrounds the associated protruding strip over a circumference of more than 180°, the ejector unit is also secured against falling out. As a result, the ejector unit can be plug-mounted onto the electronic device housing during assembly by the protruding strip being clipped (snapped) into the latching groove. Although the disadvantage of the pivot angle of the ejector unit being restricted by the latching groove is incurred as a result, it has been found that the restricted pivot angle of the ejector unit has virtually no effect on the removal of a plug connector from a plug contact unit and the advantage of improved bearing of the ejector unit far outweighs this disadvantage.

The strip preferably extends along the width of the ejector unit, that is to say from the centre in the direction of the side edges. This has the advantage of more uniform force distribution over the width of the electronic device housing.

It is particularly advantageous when the ejector unit has two ejector arms which are arranged at a distance from one another. Said ejector arms can particularly advantageously be arranged so as to adjoin the side edges of the ejector unit, as seen in the direction of the width of the ejector unit. This prevents the plug connector from tilting when it is routed out of the plug contact unit by the ejector unit being pivoted.

The ejector unit can be operated either by a separate operating tool, for example a screwdriver.

However, it is particularly advantageous when an operating section extends at an angle from the at least one ejector arm, said angle preferably being approximately 90° (70 to 120°). The strip is then arranged beneath the transition region of the ejector arm and the operating section.

Therefore, the ejector unit is preferably designed with an L-shaped cross section, wherein the strip is then integrally formed on the ejector unit beneath the ejector arms at the transition between the ejector arms and the operating section.

The strip is preferably in the form of part of a circle in cross section and is designed as a round bar which is integrally formed on the operating section and the adjoining at least one ejector arm by way of a web over its length. The strip then projects beyond the web and, in this way, protrudes relative to the web.

It is particularly advantageous when the strip has at least one lug which projects from the protruding portion, and the latching groove has an associated recess for receiving the at least one latching lug. A stop can then be formed between the lug and the recess with the aid of this lug, which projects from the strip which, for example, is in the form of part of a circle in cross section, and the recess, the said stop preventing or at least making it difficult for the ejector unit to be unintentionally prised out of the latching groove.

The at least one lug can either extend only over part of the length of the strip, but it is particularly advantageous when the lug and the associated recess extend over the entire width of the strip. In this way, the force which acts on the stop which is formed by the lug and the latching groove is once again distributed uniformly when the ejector unit is unintentionally prised out.

The ejector unit and at least the region of the electronic device housing adjoining the latching groove are preferably produced from an electrically insulating plastic material. This has the advantage that the latching groove yields elastically when the strip is snapped in and holds the strip in a secure and stable manner in the latching groove after the strip is clipped into the latching groove.

Latching the ejector unit has the advantage that deformation of the side walls toward the outside in the series-connection direction of the electronic device housing on a top-hat rail is avoided. To this end, latching pins in each case protrude from the side walls in the direction of the opposite side wall, said latching pins being matched to the latching openings in the ejector unit such that in each case one latching pin enters an associated latching opening and is latched by the said latching opening when the ejector unit is pivoted into the latching position, that is to say with the free end in the direction of the electronic device housing and latching pins. In this case, the latching openings are preferably located in the boundary regions of that side of the ejector unit which faces the electronic device housing.

It is once again advantageous when the latching openings in the ejector unit surround the associated latching pins in each case over a circumference of more than 180°. As a result, the latching pins are clipped or snapped in the associated latching opening possibly by elastic deformation of the latching opening or of the latching pin.

In contrast to solutions in which latching pins are arranged on the side edges of the ejector unit, the provision of a latching opening in the ejector unit has the advantage that the side walls are not pushed outward, and therefore deformed, in a different direction or width direction of the electronic device housing during locking in the latching position.

The invention will be explained in greater detail below with reference to exemplary embodiments using the appended drawings, in which.

Figure 4:
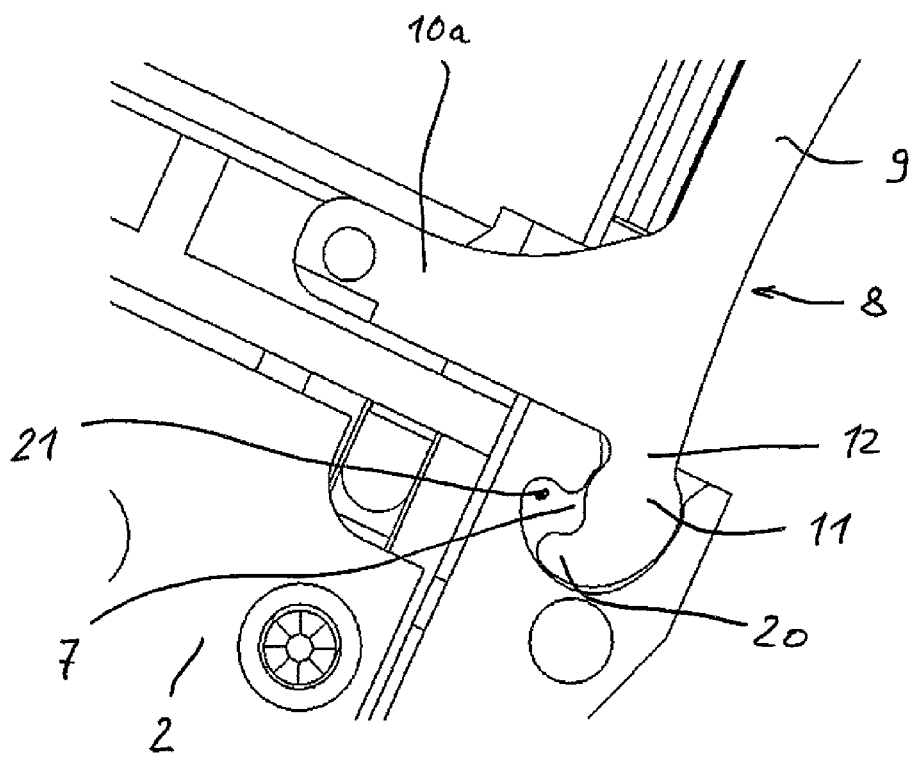
Figure 4:
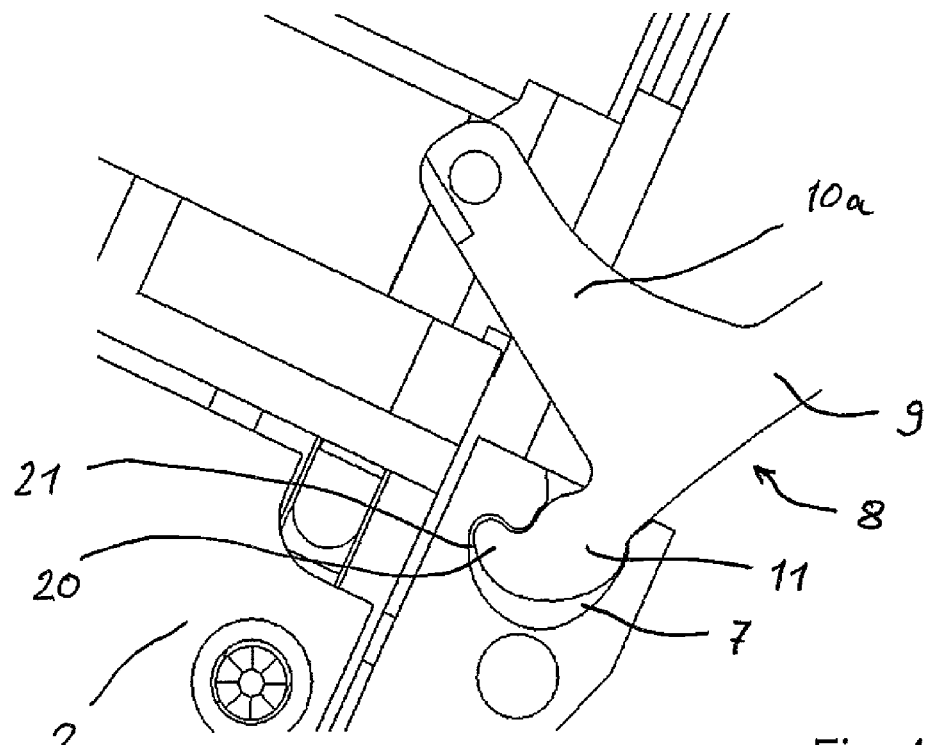
Figure 5:
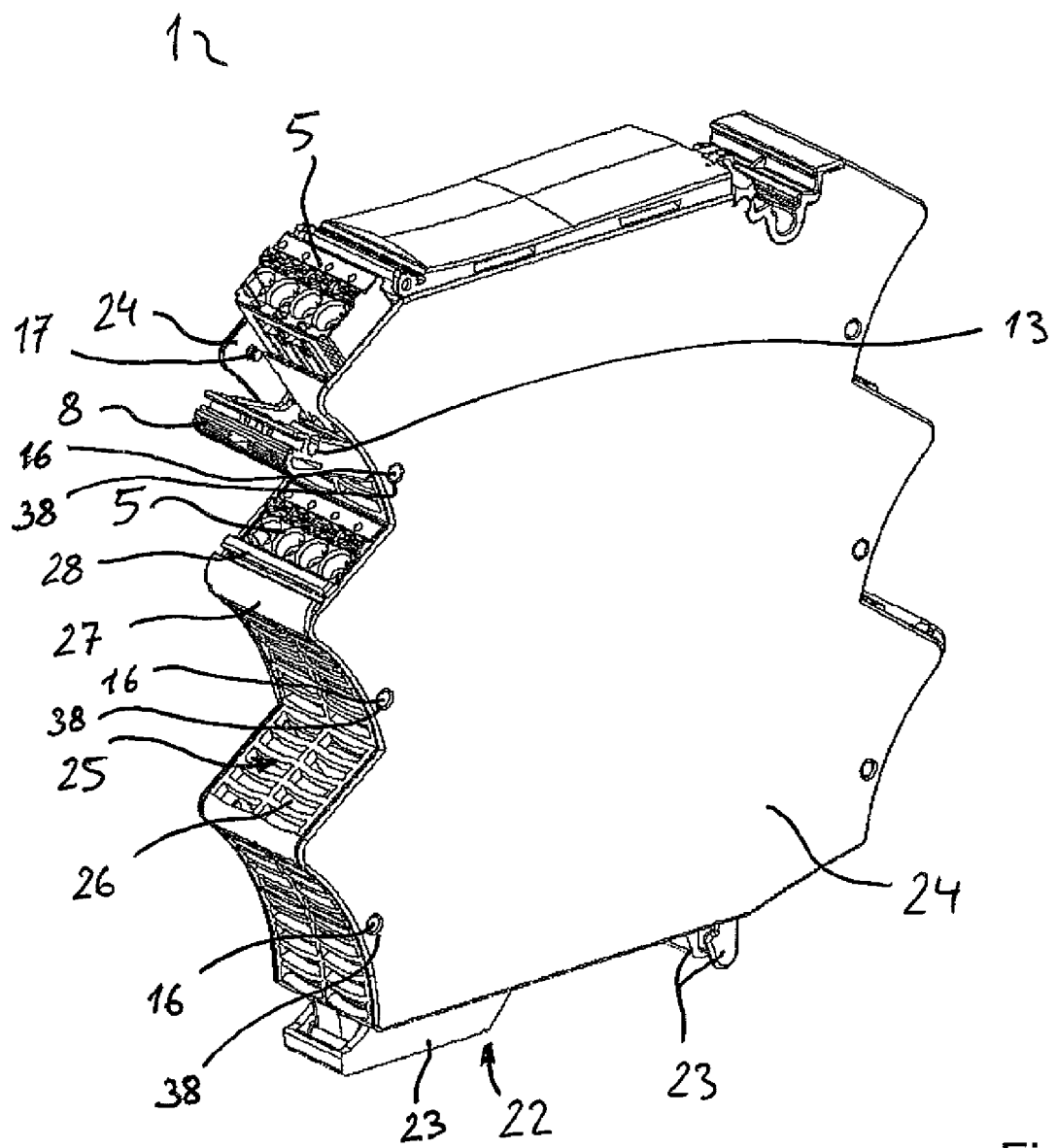
Figure 6:
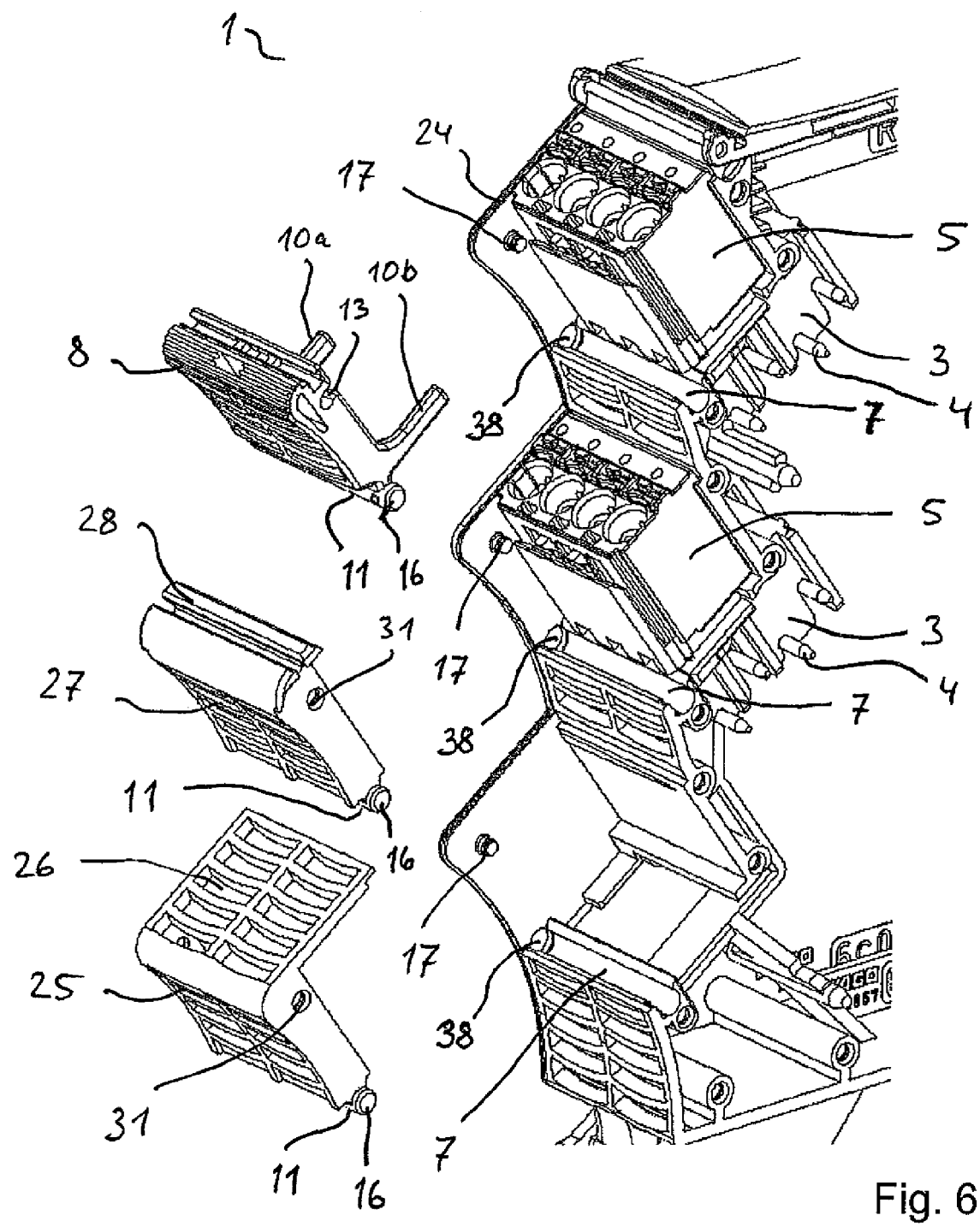
Figure 7:
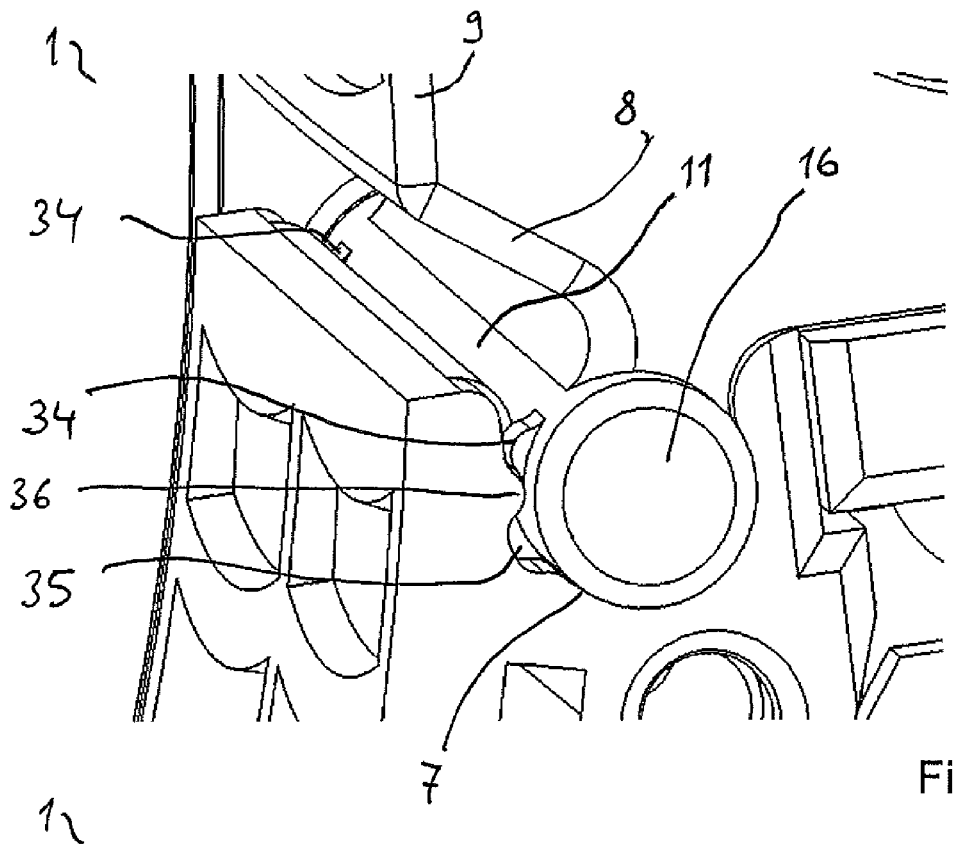
Figure 8:
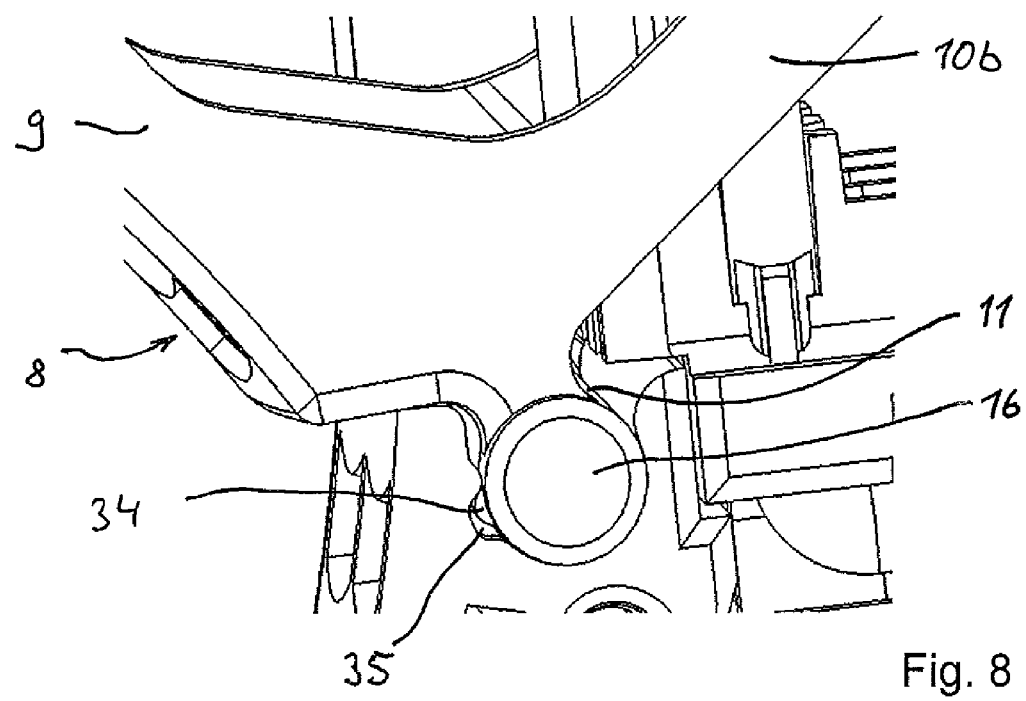
Figure 9:
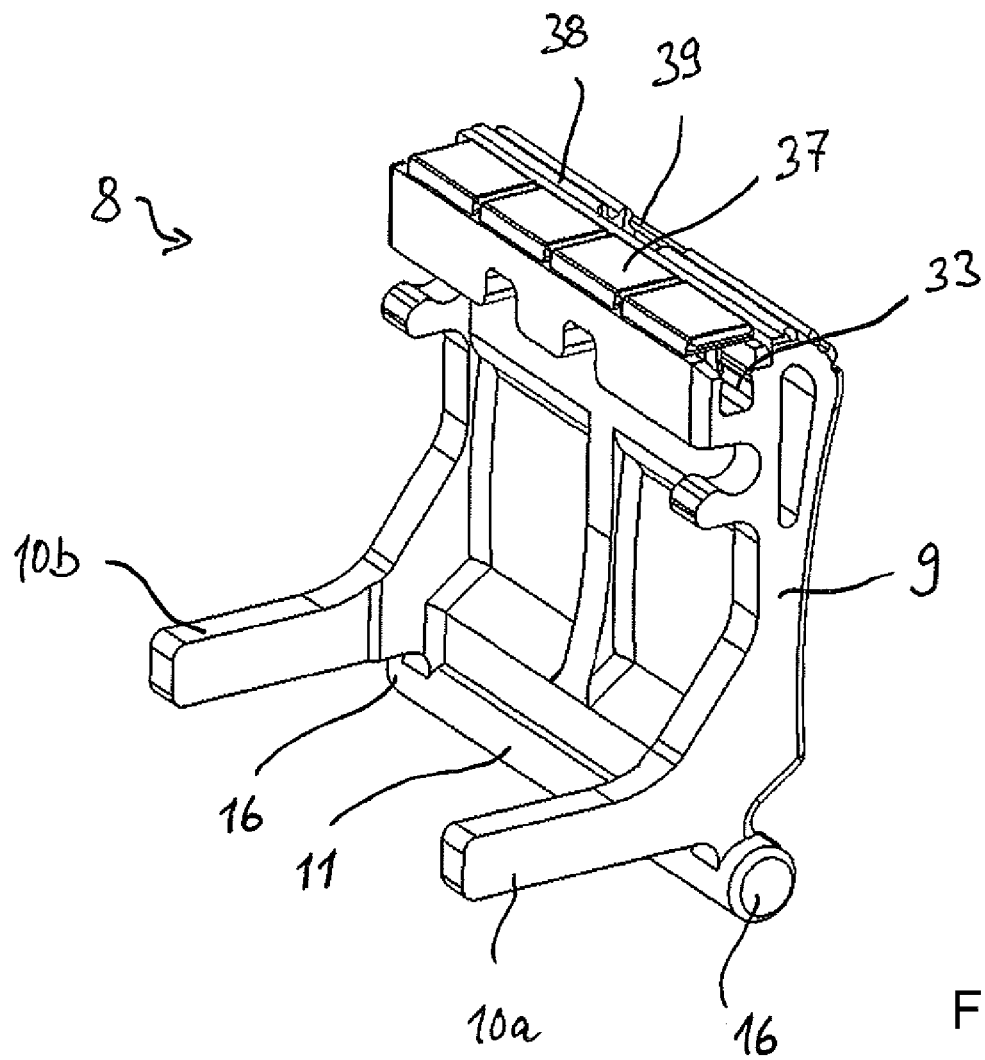
Figure 10:
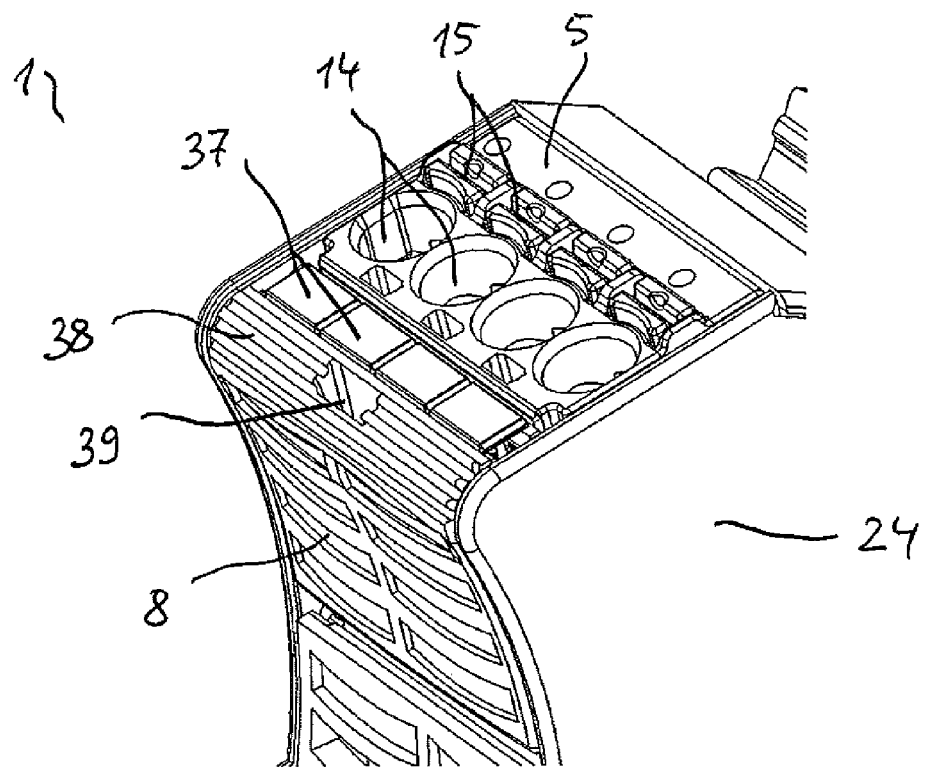
Figure 11:
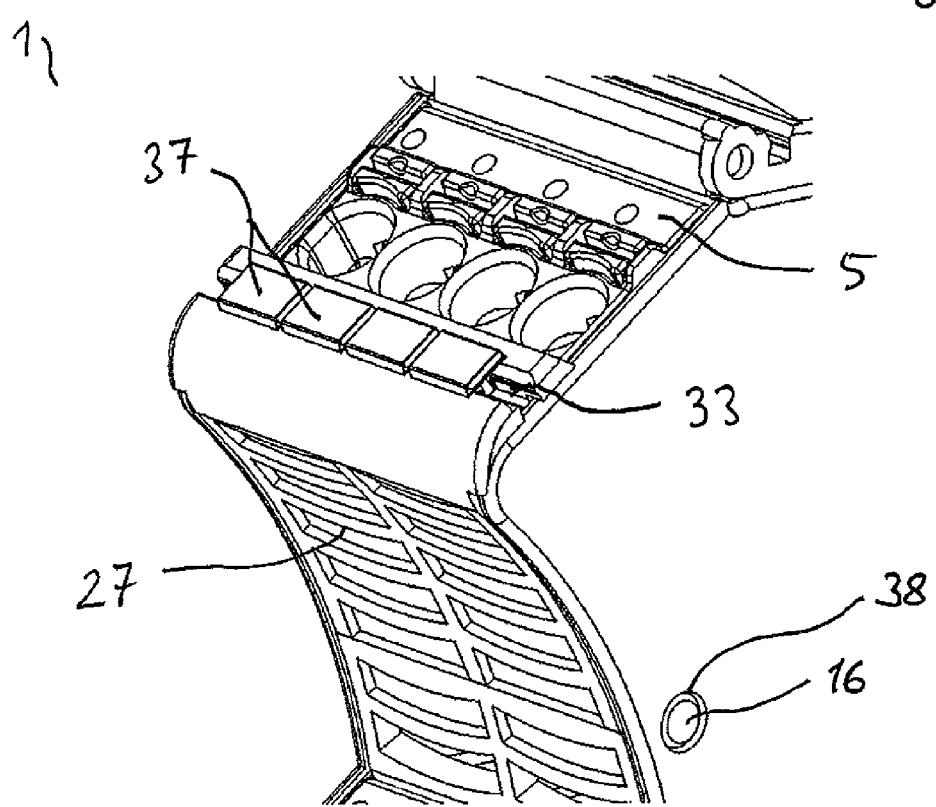

FIG. 4a) shows a cross-sectional view of an ejector unit, which is snapped into a latching groove, in partial section with a stop;

FIG. 4b) shows a cross-sectional view of the ejector unit according to FIG. 4a) in the pivoted state;

FIG. 5 shows a perspective view of an embodiment of an electronic device housing with a pivoted ejector unit;

FIG. 6 shows a partial sectional view of the electronic device housing from FIG. 5 with a pivotable ejector unit and plug connector fixing caps or covering caps which can optionally be fitted instead of the ejector unit;

FIG. 7 shows a view of a detail of an electronic device housing with an ejector unit in the latching position with projecting lugs;

FIG. 8 shows a view of a detail of an electronic device housing with an ejector unit in the latching position with projecting lugs in the open position;

FIG. 9 shows a perspective view of an ejector unit with labelling elements;

FIG. 10 shows a view of a detail of an electronic device housing with an ejector unit and labelling elements;

FIG. 11 shows a view of a detail of an electronic device housing with a fixing element and labelling elements.

Figure 1:
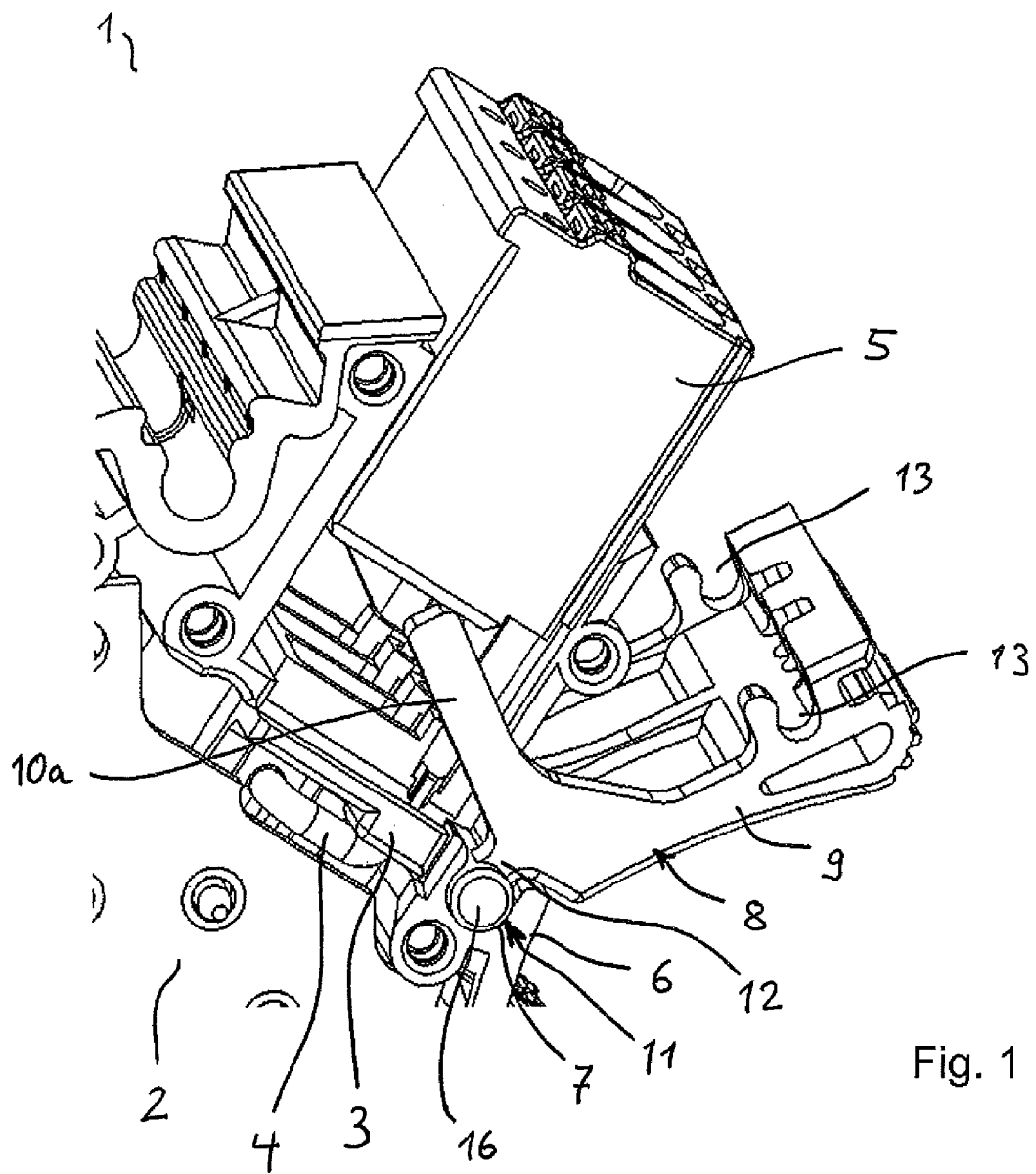
FIG. 1 shows a perspective partial sectional view of an electronic device housing with a plug contact unit and an ejector unit and also a plug connector in the unclamped state of the plug connector.

FIG. 1 shows a perspective partial sectional view of an electronic device housing 1 into which in a printed circuit board 2 with electronics is installed. The printed circuit board 2 is fitted with at least one plug contact unit 3 which, in the illustrated exemplary embodiment, is in the form of a male contact connector strip with protruding male contacts 4. The plug contact unit 3 is intended to receive a plug connector 5 which can be plug-mounted onto the plug contact unit 3 in order to make electrical contact with electrical conductors, which are connected to the plug connector 5, by way of the male contacts 4 of the plug contact unit 3.

The figure shows a plug connector 5 of the type described, for example, in DE 10 2009 035 716 A1, reference being made to the entire document.

The electronic device housing 1 has, adjacent to the plug contact unit 3, a bearing section 6 with a latching groove 7 for pivotably mounting an ejector unit 8. The ejector unit 8 is L-shaped in cross section and when viewed from the side and has an operating section 9 from which at least one ejector arm, in the illustrated exemplary embodiment two ejector arms 10a, 10b which are at a distance from one another, extends/extend at an angle. The ejector arms 10a, 10b extend from the bearing section 6 in the direction of the plug contact unit 3 and are matched to the plug contact unit 3 and the associated plug connector 5 such that the plug connector 5 is drawn away from the plug contact unit 3 with the aid of the ejector arms 10a, 10b when the ejector unit 8 is pivoted in accordance with FIG. 1.

The figure shows that, by pivoting the ejector unit 8, the plug connector 5 is routed upward from the contact pins 4 of the plug contact unit 3 without tilting.

It is clear that a strip 11 which has a protruding cross section is integrally formed on the ejector unit 8 by a web 12 beneath the transition between the ejector arms 10a, 10b and the operating section 9. The strip 11 is inserted into the latching groove 7, wherein the latching groove 7 surrounds the strip 11 over a circumference of more than 180°. In this way, the strip 11 is snapped or clipped into the latching groove 7 and secured against being removed in the upward direction by engaging over the latching groove 7 which is likewise in the form of part of a circle in cross section.

The strip 11 and the corresponding latching groove 7 preferably extend along the width and, in the illustrated exemplary embodiment, over virtually the entire width of the ejector unit 8. That is to say, the strip 11 extends from the centre of the ejector unit 8 on both sides in the direction of the outside, and the length of the strip 11 therefore corresponds substantially to the width of the ejector unit 8. In this case, the strip 11 can be somewhat shorter or else somewhat longer, but is continuous from one side region, over the central region, to the opposite side region.

FIG. 1 also shows that, in the illustrated exemplary embodiment, there can be latching openings 13 on the opposite side walls of the ejector unit 8 in order to latch the ejector unit 8, in the locked state in which the plug connector 5 is fully plug-mounted onto the plug contact unit 3, to latching pins which project (not shown) from the side walls of the electronic device housing. In this case, the latching openings 13 form a latching stop with corresponding latching means on the side walls.

Figure 2:
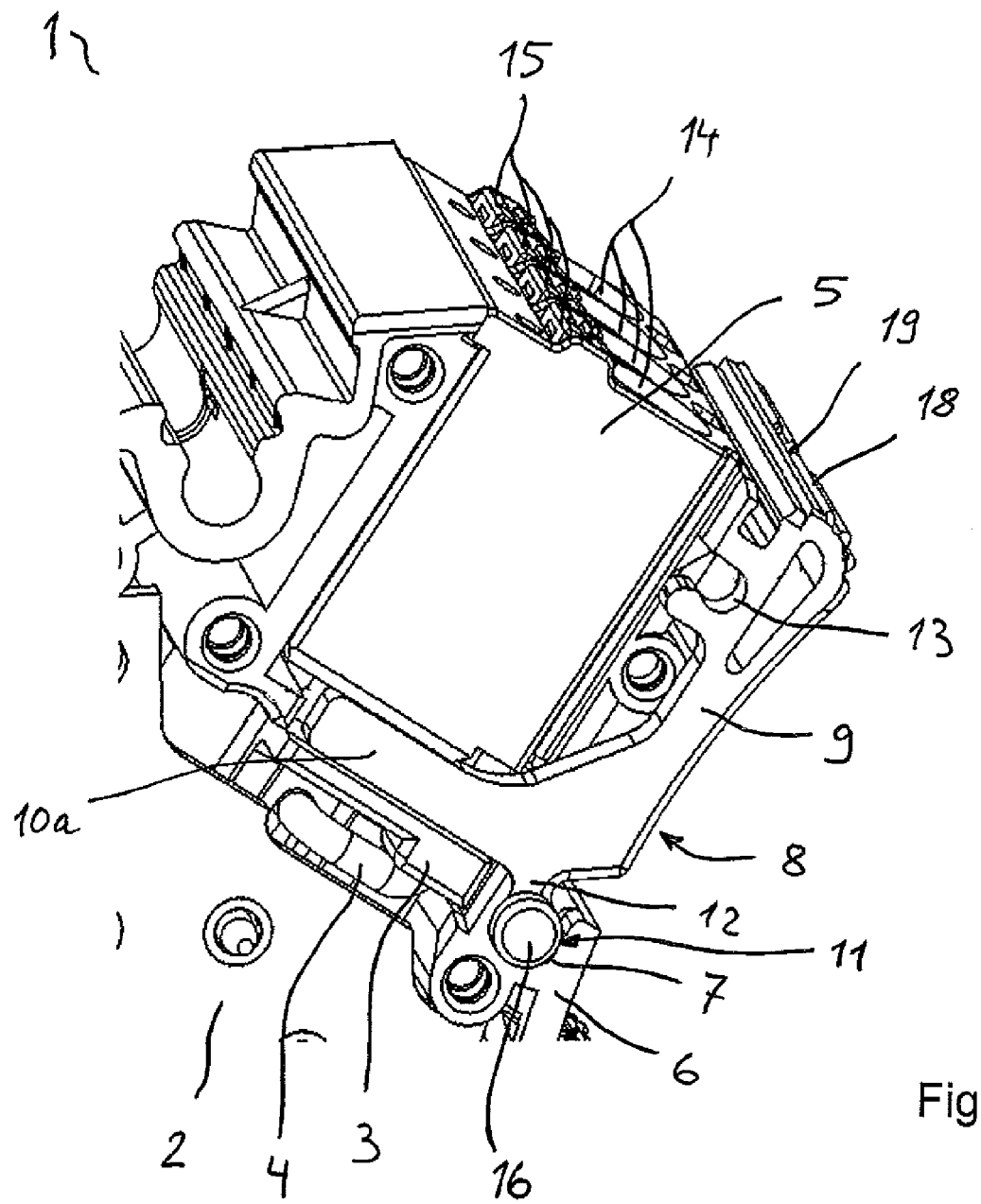
FIG. 2 shows a perspective view of the electronic device housing from FIG. 1 in the plug-mounted state of the plug connector.

FIG. 2 shows a partial sectional view of the electronic device housing 1 with another embodiment of an ejector unit 8 which is pivoted in the latching position. The figure shows that the plug connector 5 is fully plug-mounted on the plug contact unit 3 in this latching position. The plug connector 5 has, in a manner which is known per se, conductor insertion openings 14 and operating buttons 15 for spring-force clamping contacts which are arranged in the interior of the plug connector 5. With the aid of these spring-force clamping contacts, electrical conductors which are inserted into conductor insertion openings 14 are pressed directly or indirectly against the contact pins 4 of the plug contact unit 3 in order to establish an electrically conductive contact-connection.

The ejector unit 8 is latched to the electronic device housing 1 in the latching position by the latching openings 13 being clipped onto latching pins 17 which are located on the side walls 4 (see FIG. 5).

The figure also shows that the ejector arms 10*a*, 10*b* are positioned (directly) beneath the plug connector 5 in the latching position.

In an exemplary embodiment which is not illustrated, it is optionally feasible for the free ends of the ejector arms 10*a* to be able to have lugs which project in the direction of the plug connector 5.

In principle, the length and design of the ejector arms 10*a* is matched to the respective position relative to the pivot axis which is formed by the strip 11 and the specific embodiment of plug connector 5 and plug contact unit 3.

The ejector unit 8 can either be pivoted by hand, this being made easier by a grooved grip surface 18 at the free end of the operating section 9. However, it is also feasible, as an alternative or in addition to this, for an operating opening 19 to be made at the free end of the operating section 9. As a result, an operating tool, for example a screwdriver, can be inserted into the operating opening 19 in order to be able to pivot the ejector unit 9 more easily by virtue of extending the lever arm.

In the exemplary embodiment of the ejector unit 8 according to FIG. 1, the strip 11 extends beyond the entire width of the ejector unit 8, that is to say it projects laterally so as to form additional pins 16 which project laterally. However, the strip 11 can also optionally extend over the entire width of the ejector unit or be shorter. The strip 11 can, as illustrated, extend at least over the width of the ejector unit 8 to the effect that it projects to a certain extent in order to form additional pivot pins 16. It is advantageous that a pivot bearing is also provided by the strip 11 in the central region.

FIG. 1 shows that the ejector unit 8 has latching openings 40 on that side which faces the plug connector, the said latching openings interacting with latching pins, which project from the plug connector 5, for locking the plug connector 5 in the latching position (FIG. 2).

Figure 3:
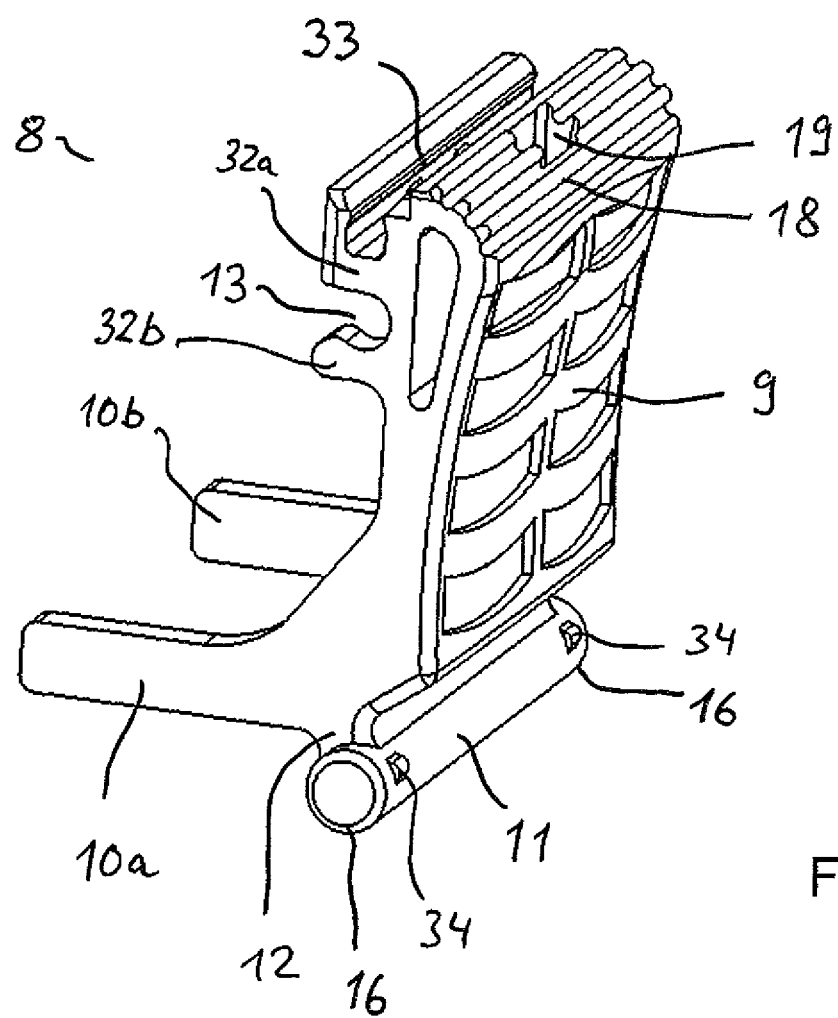
FIG. 3 shows a perspective view of an exemplary ejector unit.

FIG. 3 shows a perspective view of the ejector unit 8 from FIGS. 1 and 2. The figure shows that the ejector unit 8 is L-shaped in cross section and when viewed from the side and has two ejector arms 10*a*, 10*b* which are arranged at a distance from one another. The ejector arms 10*a*, 10*b* are arranged so as to adjoin the side edges of the ejector unit 8, as seen in the direction of the width of the ejector unit 8.

At a distance from the ejector arms 10*a*, 10*b*, the latching grooves 13 are forth on the operating arm 9 by webs 32*a*, 32*b* which project in the direction of the ejector arms 10*a*, 10*b* and form the latching groove 13.

The figure shows that a further latching groove 33 is formed on the upper edge of the ejector unit 8, said further latching groove being open at the top and being opened to receive identification carriers or identification plates. In this way, identification carriers which are known per se can be clipped into this latching groove 33 and thereby secured to the ejector unit 8.

The figure also shows that projecting lugs 34 are arranged in the side region of the strip 11. These lugs 34 can interact with recesses 35 and projections 36 in the latching groove 7 for the strip 11 in order to hold the ejector unit 8 in a defined open position and/or in the latching position (FIG. 2).

FIGS. 4*a*) and 4*b*) show a further embodiment of the strip 11 and the associated latching groove 7. The strip 11 again has a protrusion and is snapped or clipped into the latching groove 7. Said strip is in the form of part of a circle in cross section and is of comparable design to the round bar of the strip described above, with the difference that a lug 20 projects from the protruding portion. The latching groove 7 has a recess 21 which is matched to the lug 20 here and which the lug 20 can enter in the pivoted-back state of the ejector unit 8. This is illustrated in FIG. 4*b*). In this way, the lug 20 and the boundary wall of the recess 21 form a stop with which the ejector unit 8 can be prevented from being undesirably prised out or this is at least made difficult and a stop for limiting the pivoting movement of the ejector unit 8 is formed.

In the illustrated exemplary embodiment, the lug 20 and the corresponding latching groove 21 extend over the entire width of the strip 11 and are integrally formed with said strip from plastic material.

FIG. 5 shows a perspective view of an electronic device housing 1 which has a housing base 22 with latching elements 23 for latching onto a mounting rail. Side walls 24 adjoin both sides of the housing base 22 at a distance from one another. The intermediate space at the end face between the side walls 24 is used for arranging the plug contact units (not shown) which are preferably accessible from above or obliquely from above for receiving an associated plug connector 5. The plug contact units can, as is customary in top-hat rail electronic device housings of this kind which can be arranged in series, be provided on several levels, selectively one above the other and selectively also at the opposite end faces.

If a space which is provided for arranging a plug contact unit is intended to be kept free, this region can be covered by a covering cap 25 which can be latched to the side walls 24. This covering cap 25 can optionally have, as illustrated, ventilation slots 26 in order to cool the interior of the electronic device housing 1.

However, it is also feasible for a permanent-locking element 27 to be latched to the side walls 24 in the region of a plug contact unit after a plug connector 5 is plug-mounted. This permanent-locking element 27 has a latching projection 28 which engages over the associated adjoining plug connector 5 and secures it against being undesirably pulled out of the electronic device housing 1.

For a desirably detachable plug connector 5 however, the above-described ejector unit 8 which is pivotably mounted in a latching groove of the electronic device housing 1 by the protruding strip which has already been described in detail is provided.

In this case, it is particularly advantageous when the ejector unit 8, as illustrated in FIG. 5, has a latching opening 13 in a region which is arranged remote from the pivot axis, as seen in the direction of the electronic device housing 1 and the plug connector 5. The latching opening 13 is matched to an associated latching pin 17 on the inner wall of the adjacent side wall 24 such that, when the ejector unit 8 is pivoted into the latching position, the latching pin 17 enters the latching opening 13 and is clipped or snapped in there by elastic deformation of the latching opening 13 or of the latching pin 17. To this end, the latching opening 13 again surrounds the latching pin 17 over a circumference of more than 180° and therefore engages over the protruding portion which is formed by the cylindrical shape of the latching pin 17.

A latching opening 13 of this kind and an associated latching pin 17 are advantageously provided on both sides of each side wall 24 or adjoining side region of the ejector unit 8.

In contrast to an optional embodiment in which latching pins are provided on the ejector unit 8 for entering latching openings in the side walls 24, the provision of a latching opening 13 in the ejector unit 8 has the advantage that the side walls 24 are not pushed outward in the series-connection direction or in the width direction of the electronic device housing 1 when the ejector unit is locked in the latching position.

FIG. 6 shows an exploded perspective view of the electronic device housing 1 from FIG. 5.

The figure shows that, in the exemplary embodiment of an ejector unit 8 illustrated here, the strip 11 which extends over the width of the ejector unit 8 projects somewhat laterally so as to form a laterally projecting pin 16 in order to enter corresponding openings 38 in the side walls 24.

The figure shows that the latching openings 13 are more than semicircular in order to surround the associated latching pin 17 over a circumference of more than 180° and to be able to snap in there. The latching opening 13 can equally also be designed as, for example, a U-shaped latching groove, wherein lugs which project opposite one another on the insertion side are provided for engaging behind a latching pin 17 which is inserted into the latching opening 13.

For the permanent-locking element 27 which can be optionally inserted, the latching pins 17 on the side walls 24 serve for securing the permanent-locking element 27 to the respective side wall 24 and for preventing pivoting. To this end, the latching pins 17 of the side walls 24 enter corresponding holes 31 in the side edges of the permanent-locking element 27.

As an alternative, a covering element 25 can also be provided in a free space with or without a plug contact unit which is likewise provided with a hole 31 on both sides, it being possible for a corresponding latching pin 17 on the side walls 24 of the electronic device housing 1 to enter the said hole.

All three elements which can be alternatively inserted, that is to say the ejector unit 8, the permanent-locking element 27 or the covering element 25, have, on the lower edge, the above-described protruding strip 11 which is inserted or clipped into an associated latching groove 7 of the electronic device housing 1.

FIG. 7 shows a perspective sectional view of a detail of an electronic device housing 1 having a latching groove 7 which has at least one trough 35 for receiving a projecting lug 34 on the strip 11. FIG. 7 shows an ejector unit 8 in the closed latching position with a cylindrical strip 11 in the lower region. Lugs 34 project forward from the strip 11 and are positioned in relation to the trough 35 such that the lug 34 butts against a projection 36 which bounds the trough 35 at the top in order to make it more difficult to cross from the latching position to the open position in the anticlockwise direction in the illustrated FIG. 7.

FIG. 8 shows the sectional view of the detail from FIG. 7 in the open position of the ejector unit 8. The figure shows that the projecting lug 34 has now overcome the projection 36 and enters the trough 35. The ejector unit 8 is held in the defined open position as a result. A certain operating force is required in order for the lug 34 to overcome the projection 36. This has the advantage that the ejector unit 8 is automatically held in the defined latching position and in the defined open position in each case.

FIG. 9 shows a perspective view of the ejector unit 8. The figure shows that identification carriers or labelling elements 37 are clipped into the latching groove 33 at the upper edge of the ejector unit 8. For example, any desired number of individual labelling elements or individual labelling elements which are connected to one another in a detachable manner by means of a defined predetermined breaking point can be arranged next to one another. Four labelling elements 37 are provided by way of example, wherein in each case one labelling element 37 is provided for each conductor insertion opening in an associated plug connector. Therefore, each conductor or the determination of each conductor insertion opening is shown to the user.

FIG. 10 shows a perspective view of an electronic device housing 1 in the region of an ejector unit 8 with plug-mounted labelling elements 37 in the region adjoining the plug connector 5. The figure shows that in each case one labelling element 37 is provided for each conductor insertion opening 14.

FIG. 11 shows a perspective view of a detail of an electronic device housing 1 in the region of a permanent-locking element 27. The figure shows that the permanent-locking element also has a latching groove 33 at the upper edge which engages over the plug connector 5. Labelling elements 37 or identification carriers can also be clipped into the latching groove 33 in the case of the permanent-locking element 27.

The invention claimed is:

1. Electronic device housing having at least one plug contact unit with contact elements for making electrically conductive contact with a plug connector which can be plug-mounted onto an associated plug contact unit, wherein the at least one plug contact unit has an ejector unit which is mounted such that it can pivot about a pivot axis and which has at least one ejector arm which can be positioned beneath the plug connector in the plugged state of a plug connector on a plug contact unit, wherein the ejector unit, in order to be pivotably mounted, has a strip which extends along the pivot axis and has a protruding cross section, and in that the electronic device housing has at least one latching groove for pivotably mounting in each case one associated ejector unit, wherein the latching groove surrounds and pivotably mounts the associated strip over a circumference of more than 180°.

2. Electronic device housing according to claim 1, wherein the ejector unit has two ejector arms which are arranged at a distance from one another.

3. Electronic device housing according to claim 2, wherein the ejector arms are arranged so as to adjoin the side edges of the ejector unit, as seen in the direction of the width of the ejector unit.

4. Electronic device housing according to claim 1, wherein an operating section extends at an angle from the at least one ejector arm, and in that the strip is arranged beneath the transition region from the ejector arm and the operating section.

5. Electronic device housing according to claim 1, wherein the strip is in the form of part of a circle in cross section.

6. Electronic device housing according to claim 1, wherein the strip has at least one lug which projects from the protruding portion, and the latching groove has an associated recess for receiving the at least one lug in order to form a stop between the lug and the recess.

7. Electronic device housing according to claim 6, wherein the lug and the associated recess extend over the width of the strip.

8. Electronic device housing according to claim 1, wherein the latching groove and the strip extend along the width of the ejector unit.

9. Electronic device housing according to claim 1, wherein the ejector unit has at least one latching opening in that boundary region which is situated remote from the strip, and associated latching pins are provided on the side walls of the electronic device housing, which side walls adjoin the ejector unit and face said ejector unit, wherein the at least one latching opening and the at least one latching pin are matched to one another such that, when the ejector unit is pivoted into a latching position, a latching pin enters the associated latching opening and is latched.

10. Electronic device housing having two side walls which are at a distance from one another and having at least one plug contact unit, which is arranged between the side walls which are at a distance from one another, with contact elements for making electrically conductive contact with a plug connector which can be plug-mounted on one another associated plug contact unit, wherein the at least one plug contact unit has an ejector unit which is mounted such that it can pivot about a pivot axis and which has at least one ejector arm which can be positioned beneath the plug connector in the plugged state of a plug connector on a plug contact unit, wherein the ejector unit has at least one latching opening in a boundary region which is situated remote from the pivot axis, and associated latching pins are provided on side walls of the electronic device housing, which side walls adjoin the ejector unit and face said ejector unit, wherein the at least one latching opening and the at least one latching pin are matched to one another such that, when the ejector unit is pivoted into a latching position, the latching pins which project from the adjoining side walls each entering said at least one latching opening in the ejector unit in said boundary region which is situated remote from the pivot axis or strip.

\* \* \* \* \*